(12) United States Patent
Delaunay

(10) Patent No.: US 9,755,091 B2
(45) Date of Patent: Sep. 5, 2017

(54) DUAL-BAND INFRARED DETECTOR AND METHOD OF DETECTING MULTIPLE BANDS OF INFRARED RADIATION

(71) Applicant: The Boeing Company, Huntington Beach, CA (US)

(72) Inventor: Pierre-Yves Delaunay, Santa Monica, CA (US)

(73) Assignee: The Boeing Company, Chicago, IL (US)

( * ) Notice: Subject to any disclaimer, the term of this patent is extended or adjusted under 35 U.S.C. 154(b) by 73 days.

(21) Appl. No.: 14/679,718

(22) Filed: Apr. 6, 2015

(65) Prior Publication Data

US 2016/0290865 A1   Oct. 6, 2016

(51) Int. Cl.
*H01L 31/0304* (2006.01)
*H01L 31/0352* (2006.01)
*H01L 31/101* (2006.01)

(52) U.S. Cl.
CPC .... *H01L 31/0304* (2013.01); *H01L 31/03046* (2013.01); *H01L 31/035236* (2013.01); *H01L 31/1013* (2013.01)

(58) Field of Classification Search
CPC ................ G01J 3/427; G01J 3/2803
See application file for complete search history.

(56) References Cited

U.S. PATENT DOCUMENTS

| | | | | |
|---|---|---|---|---|
| 5,113,076 A | * | 5/1992 | Schulte | H01L 27/1446 250/330 |
| 5,479,032 A | * | 12/1995 | Forrest | H01L 31/0352 257/184 |
| 5,517,029 A | * | 5/1996 | Yanka | H01L 27/14652 250/332 |
| 5,731,621 A | * | 3/1998 | Kosai | B82Y 20/00 250/338.4 |
| 6,184,538 B1 | * | 2/2001 | Bandara | B82Y 20/00 250/338.4 |
| 6,229,152 B1 | * | 5/2001 | Dries | B82Y 20/00 257/17 |
| 6,407,439 B1 | * | 6/2002 | Hier | B82Y 20/00 257/431 |
| 6,455,908 B1 | * | 9/2002 | Johnson | B82Y 20/00 257/184 |
| 7,053,293 B2 | | 5/2006 | Uppal | |
| 7,368,762 B2 | | 5/2008 | Tennant et al. | |

(Continued)

OTHER PUBLICATIONS

Rogalski, Antoni; Infrared Detectors: An Overview; Infrared Physics & Technology 43; 2002; pp. 187-210.

(Continued)

*Primary Examiner* — Christine Sung
(74) *Attorney, Agent, or Firm* — Armstrong Teasdale LLP

(57) ABSTRACT

A dual-band infrared detector is provided. The dual-band infrared detector includes a first absorption layer sensitive to radiation in only a short wavelength infrared spectral band, a plurality of barrier layers coupled to the first absorption layer, and a second absorption layer coupled to the plurality of barrier layers opposite the first absorption layer. The second absorption layer is sensitive to radiation in only a medium wavelength infrared spectral band, and the first and second absorption layers are formed from materials having a lattice parameter mismatch less than a predetermined threshold.

23 Claims, 4 Drawing Sheets

(56) References Cited

U.S. PATENT DOCUMENTS

| | | | |
|---|---|---|---|
| 8,450,773 B1* | 5/2013 | Kim | H01L 31/1844 |
| | | | 250/338.4 |
| 8,847,202 B1* | 9/2014 | Nosho | H01L 31/02016 |
| | | | 257/15 |
| 9,146,157 B1* | 9/2015 | Rajavel | H01L 27/14649 |
| 9,207,120 B2* | 12/2015 | Rajavel | G01J 3/36 |
| 9,214,581 B2* | 12/2015 | Khoshakhlagh | H01L 31/03523 |
| 2002/0125472 A1* | 9/2002 | Johnson | B82Y 20/00 |
| | | | 257/21 |
| 2007/0158638 A1* | 7/2007 | Perera | B82Y 20/00 |
| | | | 257/13 |
| 2007/0173883 A1* | 7/2007 | Keegan | A61F 2/0095 |
| | | | 606/200 |
| 2009/0256231 A1 | 10/2009 | Klipstein | |
| 2010/0230720 A1 | 9/2010 | Wicks | |
| 2011/0049566 A1 | 3/2011 | Perera et al. | |
| 2013/0020666 A1 | 1/2013 | Smith | |
| 2013/0043372 A1* | 2/2013 | Wehner | H01L 27/14652 |
| | | | 250/208.1 |
| 2013/0043459 A1* | 2/2013 | Chen | H01L 21/02398 |
| | | | 257/22 |
| 2013/0146998 A1* | 6/2013 | Ting | H01L 31/02016 |
| | | | 257/431 |
| 2014/0225064 A1* | 8/2014 | Khoshakhlagh | H01L 31/03523 |
| | | | 257/21 |
| 2014/0264270 A1* | 9/2014 | Dutta | H01L 27/14636 |
| | | | 257/14 |

OTHER PUBLICATIONS

Gunapala, S.D. et al.; 1024×1024 Pixel Mid-Wavelength and Long-Wavelength Infrared QWIP Focal Plane Arrays for Imaging Applications; Semiconductor Science and Technology; vol. 20; May 1, 2005; pp. 473-480.

Delaunay, Pierre-Yves et al.; High Quantum Efficiency Two Color Type-II InAs/GaSb n-i-p-p-i-n Photodiodes; Applied Physics Letter 92; 2008; 3 pp.

Huang, Edward Kwei-wei et al.; Active and Passive Infrared Imager Based on Short-Wave and Mid-Wave Type-II Superlattice Dual-Band Detectors; Optic Letters; vol. 38, No. 1; Jan. 1, 2013; pp. 22-24.

Melkonian, Leon et al.; Performance of MWIR and SWIR HgCdTe-based Focal Plane Arrays at High Operating Temperatures; Proceedings of SPIE; vol. 7660; 2010; 11 pp.

Klipstein, Philip et al.; High Operating Temperature Xbn-InAsSb Bariode Detectors; Proceedings of SPIE; vol. 8268; 2012; 8 pp.

Rajavel, Rajesh D. et al.; MWIR Photodetector with Compound Barrier with P—N Junction; U.S. Appl. No. 14/069,232, filed Oct. 31, 2013.

* cited by examiner

DUAL-BAND INFRARED DETECTOR AND METHOD OF DETECTING MULTIPLE BANDS OF INFRARED RADIATION

BACKGROUND

The field of the present disclosure relates generally to semiconductor technology and, more specifically, to a dual-band infrared detector capable of detecting radiation in both short wavelength and medium wavelength infrared spectral bands.

At least some known photodetector devices are formed from a semiconductor material, such as Indium Arsenide Antimonide (InAsSb). InAsSb has a high quantum efficiency, enhanced dark current performance in certain spectral bands, and a low direct energy gap when compared to other Group III-V semiconductor materials. As such, InAsSb is capable of effectively detecting radiation in the medium wavelength infrared spectral band, which generally facilitates detecting radiation from the thermal infrared signature of an object, for example. However, an inherent lattice mismatch between InAsSb and known substrates arises when attempting to lower the detection range of InAsSb to a shorter spectral band. The inherent lattice mismatch causes defects to be formed in the photodetector device. Moreover, using materials sensitive to radiation in only the medium wavelength infrared spectral band to detect radiation in the short wavelength infrared spectral band, for example, results in high dark currents and prevents medium wavelength radiation from reaching the medium wavelength infrared spectral band.

At least some known semiconductor materials are capable of performing dual-band infrared detection. Exemplary semiconductor materials capable of dual-band infrared detection include, but are not limited to, Mercury Cadmium Telluride (HgCdTe) detectors, quantum well infrared photon (QWIP) detectors, and Indium Arsenide/Gallium Antimonide (InAs/GaSb) superlattice detectors. HgCdTe detectors are generally grown on a relatively expensive Cadmium Zinc Telluride (CdZnTe) substrate, thereby limiting the use of HgCdTe detectors in large arrays, or in single use applications. QWIP detectors have a narrow spectral response and a low operating temperature, which makes QWIP detectors generally unsuitable for applications requiring high frame rates. InAs/GaSb superlattice detectors have a high dark current performance due to surface leakage, when compared to other known photodetector devices. Moreover, Indium Gallium Arsenide (InGaAs) effectively detects radiation in the short wavelength infrared spectral band, but is generally unable to detect radiation in other spectral bands because of its high bandgap.

BRIEF DESCRIPTION

In one aspect, a dual-band infrared detector is provided. The dual-band infrared detector includes a first absorption layer sensitive to radiation in only a short wavelength infrared spectral band, a plurality of barrier layers coupled to the first absorption layer, and a second absorption layer coupled to the plurality of barrier layers opposite the first absorption layer. The second absorption layer is sensitive to radiation in only a medium wavelength infrared spectral band, and the first and second absorption layers are formed from materials having a lattice parameter mismatch less than a predetermined threshold.

In another aspect, an imaging system is provided. The imaging system includes a readout integrated circuit and a dual-band infrared detector electrically coupled to the readout integrated circuit. The dual-band infrared detector includes a first absorption layer, said first absorption layer sensitive to radiation in only a short wavelength infrared spectral band, a plurality of barrier layers coupled to the first absorption layer, and a second absorption layer coupled to the plurality of barrier layers opposite the first absorption layer. The second absorption layer is sensitive to radiation in only a medium wavelength infrared spectral band, wherein the first and second absorption layers are formed from materials having a lattice parameter mismatch of less than a predetermined threshold. The readout integrated circuit is configured to selectively apply a bias voltage to the dual-band infrared detector.

In yet another aspect, a method of detecting multiple bands of infrared radiation is provided. The method includes selectively applying a bias voltage to a dual-band infrared detector including a first absorption layer and a second absorption layer, wherein the first absorption layer formed from an InAs/AlSb superlattice structure is sensitive to radiation in only a short wavelength infrared spectral band, and the second absorption layer formed from an InAsSb alloy material is sensitive to radiation in only a medium wavelength infrared spectral band. The method also includes receiving a first electrical signal from the dual-band infrared detector when the bias voltage having a first polarity is applied thereto, and receiving a second electrical signal from the dual-band infrared detector when the bias voltage having a opposite second polarity is applied thereto. The first electrical signal corresponds to detection of radiation in the short wavelength infrared spectral band, and the second electrical signal corresponds to detection of radiation in the medium wavelength infrared spectral band.

DETAILED DESCRIPTION

The implementations described herein relate to a dual-band infrared detector formed from a unique combination of semiconductor materials. The semiconductor materials enable the dual-band infrared detector to detect radiation in both the short wavelength and medium wavelength infrared spectral bands. More specifically, the dual-band infrared detector includes a first absorption layer, a plurality of barrier layers, and a second absorption layer sensitive to radiation in a different infrared spectral band than the first absorption layer. As described above, Indium Arsenide Antimonide (InAsSb) is capable of effectively detecting radiation in the medium wavelength infrared spectral band. As such, in one implementation, a material used to form the second absorption layer is InAsSb, and a material used to form the second absorption layer is selected to ensure an inherent lattice parameter mismatch between the absorption layers is less than a predetermined threshold. For example, the material of the second absorption layer may be a superlattice structure including Indium Arsenide and Aluminum Antimonide (InAs/AlSb) in varying proportions.

Superlattice structures formed from InAs/AlSb are capable of effectively detecting radiation in the short wavelength infrared spectral band, and the thickness of the layers of Indium Arsenide and Aluminum Antimonide can be selected to achieve different bandgaps for different lattice parameters.

Combining the InAsSb and InAs/AlSb absorption layers facilitates providing a low-cost device that can perform dual-band imaging using a back-to-back diode architecture. As such, the dual-band infrared detector described herein may be used in a targeting system, for example. More specifically, the InAsSb absorption layer is used to perform medium wavelength infrared imaging up to 5 micrometers, and the InAs/AlSb absorption layer is used to perform short wavelength infrared imaging up to 2.5 micrometers. The short wave infrared imaging capability provides targeting capabilities when used with a laser designator, and the medium wave infrared imaging capability provides alternate and independent targeting capabilities for providing a background context to the position of the target. As such, the dual-band infrared detector described herein facilitates providing a more robust targeting system when compared to targeting systems that rely on imaging in a single infrared spectral band alone. Moreover, the adding MWIR imaging capabilities to the dual-band infrared detector described herein enables a target to be tracked if the laser designator is moving, inaccurate, or disrupted.

Figure 1:
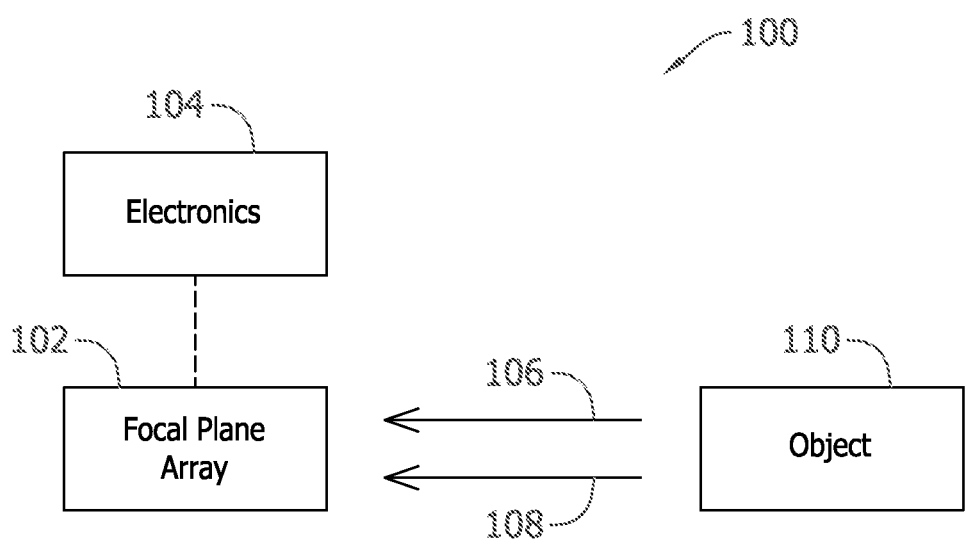
FIG. 1 is a block diagram of an exemplary environment in which a dual-band infrared detector may be used.

FIG. 1 is a block diagram of an exemplary environment 100 in which a focal plane array 102 may be used. In the exemplary implementation, focal plane array 102 is coupled in communication with electronics 104, and is capable of detecting a first infrared radiation 106 and a second infrared radiation 108 emitted from an object 110. First infrared radiation 106 is emitted from object 110 in a first infrared spectral band, and second infrared radiation 108 is emitted from object 110 in a second infrared spectral band different than the first infrared spectral band. More specifically, in one implementation, the first infrared spectral band corresponds to short wavelength infrared radiation (SWIR), having wavelengths of up to 2.5 micrometers, and the second spectral band corresponds to medium wavelength infrared radiation (MWIR), having wavelengths within a range between 2.5 and 5 micrometers. In some implementations, at least one of the first infrared spectral band and the second infrared spectral band corresponds to less than a full range of the SWIR or MWIR wavelengths and/or spans one or more of SWIR and MWIR wavelength ranges. Additionally, in some implementations, the first infrared spectral band partially overlaps with the second infrared spectral band.

As described above, focal plane array 102 is coupled in communication with electronics 104, which enables focal plane array 102 to transmit infrared detection data to electronics 104, or enables electronics 104 to transmit instructions to focal plane array 102. Moreover, electronics 104 performs one or more functions to facilitate processing of infrared detection data, such as image processing, for example filtering and/or object recognition, and other functions such as storage and/or transmission of data to one or more additional computing devices (not shown).

In one implementation, and as will be described in more detail below, electronics 104 includes one or more components having functionality that enables focal plane array 102 to selectively detect radiation in the first and second infrared spectral bands. More specifically, focal plane array 102 facilitates converting infrared radiation to electrical signals for further processing and/or storage, and electronics 104 facilitates processing the electrical signals. As such, focal plane array 102 has a configuration that enables a dual-band infrared detector 111 (not shown) to operate as a bias-selectable dual-band detector.

Figure 2:
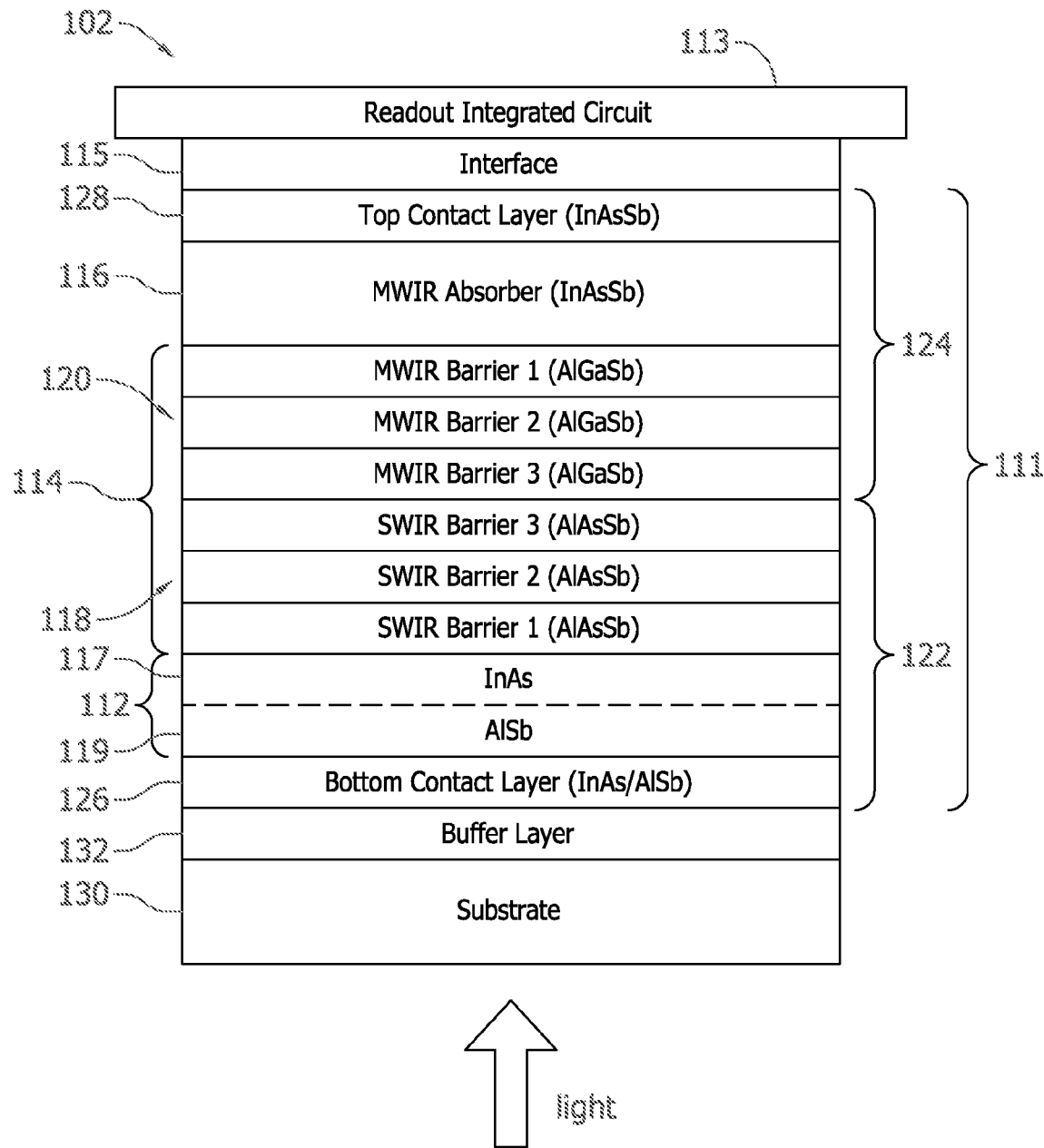
FIG. 2 is a schematic illustration of the dual-band infrared detector shown in FIG. 1.

FIG. 2 is a schematic illustration of focal plane array 102 for use in an imaging system, for example. In the exemplary implementation, focal plane array 102 includes a dual-band infrared detector 111 electrically coupled to a readout integrated circuit 113 via an interface 115. Dual-band infrared detector 111 includes a first absorption layer 112 sensitive to radiation in only a short wavelength infrared spectral band, a plurality of barrier layers 114 coupled to first absorption layer 112, and a second absorption layer 116 coupled to the plurality of barrier layers 114 opposite first absorption layer 112. Second absorption layer 116 is sensitive to radiation in only a medium wavelength infrared spectral band, and first and second absorption layers 112 and 116 are formed from materials having a lattice parameter mismatch less than a predetermined threshold. In one implementation, the predetermined threshold is 0.8 percent. As such, maintaining the lattice parameter mismatch less than 0.8 percent enables dual-band infrared detector 111 to be formed with a reduced amount of structural defects. Alternatively, it should be understood that the materials used to form first and second absorption layers 112 and 116 may be greater than the predetermined threshold, which would result in a greater amount of structural defects being formed in dual-band infrared detector 111 as the mismatch increases.

First absorption layer 112 may be formed from any material that enables dual-band infrared detector 111 to function as described herein. In the exemplary implementation, first absorption layer 112 is sensitive to wavelengths of up to 2.5 micrometers, and is formed from a superlattice structure including at least one layer 117 of a first semiconductor material and at least one layer 119 of a second semiconductor material. Alternatively, first absorption layer 112 is sensitive to wavelengths of up to 4.5 micrometers. The first semiconductor material includes Indium and Arsenic (i.e., Indium Arsenide), and the second semiconductor material includes Aluminum and Antimony (i.e., Aluminum Antimonide). Moreover, a thickness of the layers 117 and 119 of the first and second semiconductor materials are selected as a function of a desired bandgap and lattice parameter of the superlattice structure.

TABLE 1

| InAs Angstroms | AlSb Angstroms | Eg meV | Wavelength μm | Lattice Parameter A | Valence Band Offset meV |
|---|---|---|---|---|---|
| 18.17 | 13.6 | 0.78 | 1.59 | 6.08867 | −508.68 |
| 24.34 | 18.21 | 0.69 | 1.79 | 6.08866 | −491.75 |
| 30.43 | 22.77 | 0.59601 | 2.08 | 6.08866 | −475.3 |
| 36.51 | 27.32 | 0.532 | 2.33 | 6.08866 | −461.89 |
| 32.40 | 42.6 | 0.478 | 2.59 | 6.08897 | −449.76 |

Table 1 illustrates several InAs/AlSb superlattice structures having different bandgaps based on the thickness of the InAs and AlSb layers, while remaining substantially lattice matched to a substrate formed from GaAs, for example. In the exemplary implementation, first absorption layer 112 includes at least one layer of InAs having a thickness of 30.43 Angstroms, and at least one layer of AlSb having a thickness of 22.77 Angstroms. Moreover, first absorption layer 112 is generally unintentionally doped with n-type background doping of less than $1.0 \times 10^{17}$ $cm^{-3}$, and has a thickness that ensures first infrared radiation 106 (shown in FIG. 1) is fully absorbed therein. In one implementation, first absorption layer 112 has a thickness of up to 5 micrometers.

Second absorption layer 116 may be formed from any material that enables dual-band infrared detector 111 to function as described herein. In the exemplary implementation, second absorption layer 116 is sensitive to wavelengths within a range between 2.5 micrometers and 5 micrometers, and is formed from an alloy including Indium, Arsenic, and Antimony ($InAs_{0.92}Sb_{0.08}$). Alternatively, second absorption layer 116 is sensitive to wavelengths of up to 8.0 micrometers. Moreover, second absorption layer 116 is generally unintentionally doped with n-type background doping of less than $1.0 \times 10^{17}$ cm³, and has a thickness that ensures second infrared radiation 108 (shown in FIG. 1) is fully absorbed therein. In one implementation, second absorption layer 116 has a thickness of up to 5 micrometers.

Barrier layers 114 include a plurality SWIR barrier layers 118 and a plurality of MWIR barrier layers 120. More specifically, dual-band infrared detector 111 includes a first p-n junction 122, which defines a SWIR detector portion of dual-band infrared detector 111, and a second p-n junction 124, which defines a MWIR detector portion of dual-band infrared detector 111. First p-n junction includes first absorption layer 112, SWIR barrier layers 118, and bottom contact layer 126, and second p-n junction includes second absorption layer 116, MWIR barrier layers 120, and top contact layer 128.

SWIR barrier layers 118 may be formed from any material that enables dual-band infrared detector 111 to function as described herein. More specifically, SWIR barrier layers 118 are formed from material that facilitates separation of photo-generated electron hole pairs. For example, SWIR barrier layers 118 are formed from a wide bandgap material when compared to first absorption layer 112, and have a substantially similar valence band offset as first absorption layer 112 to facilitate proper extraction of minority carrier holes. In the exemplary implementation, SWIR barrier layers 118 are formed from an alloy including Aluminum, Arsenic, and Antimony ($AlAs_{0.07}Sb_{0.93}$).

In some implementations, the doping of SWIR barrier layers 118 is selected to ensure first p-n junction 122 is defined within the wide bandgap material. Any number of layers and values of doping may be used that enables dual-band infrared detector 111 to function as described herein and, in one implementation, the SWIR barrier layer 118 coupled to first absorption layer 112 has n-type doping.

MWIR barrier layers 120 may be formed from any material that enables dual-band infrared detector 111 to function as described herein. More specifically, MWIR barrier layers 120 are formed from material that facilitates separation of photo-generated electron hole pairs. For example, MWIR barrier layers 120 are formed from a wide bandgap material when compared to second absorption layer 116, and have a substantially similar valence band offset as second absorption layer 116 to facilitate proper extraction of minority carrier holes. In the exemplary implementation, MWIR barrier layers 120 are formed from an alloy including Aluminum, Gallium, and Antimony ($Al_{0.88}Ga_{0.12}Sb$). Alternatively, MWIR barrier layers 120 may be formed from an alloy including Aluminum, Arsenic, and Antimony ($AlAs_{0.09}Sb_{0.91}$) to facilitate mitigating a discontinuity in the valence band between MWIR barrier layers 120 and second absorption layer 116.

In some implementations, the doping of MWIR barrier layers 120 is selected to ensure second p-n junction 124 is defined within the wide bandgap material. Any number of layers and values of doping may be used that enables dual-band infrared detector 111 to function as described herein and, in one implementation, the MWIR barrier layer 120 coupled to second absorption layer 116 has n-type doping. As such, first and second absorption layers 112 and 116 have opposite doping as at least one barrier layer of barrier layers 114.

Dual-band infrared detector 111 also includes a bottom contact layer 126 coupled to first absorption layer 112, and a top contact layer 128 coupled to second absorption layer 116. Bottom contact layer 126 is a highly doped layer, is highly conductive, and has a low electrical resistance relative to first absorption layer 112 and barrier layers 114. Bottom contact layer 126 may also have any thickness and doping that enables dual-band infrared detector 111 to function as described herein. For example, in some implementations, bottom contact layer 126 has a thickness of less than 0.5 micrometers, and a doping within a range between $1.0 \times 10^{17}$ cm$^{-3}$ and $1.0 \times 10^{19}$ cm$^{-3}$. Moreover, bottom contact layer 126 may be formed from any material that enables dual-band infrared detector to function as described herein. In the exemplary implementation, bottom contact layer 126 is formed from an alloy including Indium, Arsenic, and Antimony ($InAs_{0.88}Sb_{0.12}$).

Likewise, top contact layer 128 is a highly doped layer, is highly conductive, and has a low electrical resistance relative to second absorption layer 116 and barrier layers 114. Top contact layer 128 may also have any thickness and doping that enables dual-band infrared detector 111 to function as described herein. For example, in some implementations, top contact layer 128 has a thickness of less than 0.5 micrometers, and a doping within a range between $1.0 \times 10^{17}$ cm$^{-3}$ and $1.0 \times 10^{19}$ cm$^{-3}$. Moreover, top contact layer 128 may be formed from any material that enables dual-band infrared detector to function as described herein. In the exemplary implementation, top contact layer 128 is formed from a superlattice structure including Indium Arsenide and Aluminum Antimonide (InAs/AlSb).

In some implementations, dual-band infrared detector 111 also includes a substrate 130 and a buffer layer 132 in which subsequent layers of material are formed thereon. Substrate 130 provides physical support for dual-band infrared detector 111, and may be formed from any material that enables dual-band infrared detector to function as described herein. Exemplary substrate materials include, but are not limited to Gallium Arsenide (GaAs), Gallium Antimonide (GaSb), Indium Arsenide (InAs), and silicon (Si). Moreover, when substrate 130 is formed from GaAs, for example, the lattice parameter mismatch between substrate 130 and other materials used to form dual-band infrared detector 111 is greater than a predetermined threshold. As such, in the exemplary implementation, buffer layer 132 is positioned between substrate 130 and bottom contact layer 126 to facilitate reducing the stress in subsequent layers of material formed on substrate 130.

As such, Table 2 illustrates an exemplary structure of dual-band infrared detector 111. However, it should be understood that any number of layers, materials, layer thicknesses, polarity, and doping may be selected that enables dual-band infrared detector 111 to function as described herein.

TABLE 2

| Layer | Material | Lattice Parameter (A) | Bandgap (eV) | Thickness (μm) | Polarity | Doping (cm$^{-3}$) |
|---|---|---|---|---|---|---|
| Substrate | GaAs | 5.6445 | | | | |
| Buffer Bottom Contact | InAs/AlSb | 6.088662 | 0.596 | 0.1 | n | 5.0E+17 |
| SWIR Absorber | InAs/AlSb | 6.088662 | 0.596 | 5 | n | 1.0E+16 |
| SWIR Barrier 1 | AlAs$_{0.07}$Sb$_{0.93}$ | 6.096447 | 2.3315 | 0.1 | n | 1.0E+16 |
| SWIR Barrier 2 | AlAs$_{0.07}$Sb$_{0.93}$ | 6.096447 | 2.3315 | 0.1 | p | 1.0E+16 |
| SWIR Barrier 3 | AlAs$_{0.07}$Sb$_{0.93}$ | 6.096447 | 2.3315 | 0.1 | p | 1.0E+18 |
| MWIR Barrier 3 | Al$_{0.88}$Ga$_{0.12}$Sb | 6.126466 | 2.0558 | 0.1 | p | 1.0E+18 |
| MWIR Barrier 2 | Al$_{0.88}$Ga$_{0.12}$Sb | 6.126466 | 2.0558 | 0.1 | p | 1.0E+16 |
| MWIR Barrier 1 | Al$_{0.88}$Ga$_{0.12}$Sb | 6.126466 | 2.0558 | 0.1 | p | 1.0E+16 |
| MWIR Absorber | InAs$_{0.92}$Sb$_{0.08}$ | 6.138188 | 0.2245 | 5 | n | 1.0E+16 |
| Top Contact | InAs$_{0.92}$Sb$_{0.08}$ | 6.138188 | 0.2245 | 5 | n | 5.0E+17 |

In operation, readout integrated circuit 113 selectively applies a bias voltage to detector 111 between first and second absorption layers 112 and 116 to enable first and second p-n junctions 122 and 124 to be separately utilized to detect first and second infrared radiation 106 and 108 (shown in FIG. 1). More specifically, readout integrated circuit 113 is electrically coupled to the infrared sensitive material of detector 111 via a plurality of indium bumps (not shown) on interface 115. Detector 111 is patterned into an array of pixels, and each pixel is electrically connected to a unit cell of readout integrated circuit 113 via respective indium bumps. Readout integrated circuit 113 then applies a bias voltage to detector 111. A first bias voltage generated by readout integrated circuit 113 is a positive bias for first p-n junction 122 and a negative bias for junction 132, which activates first p-n junction 122 and deactivates second p-n junction 124. With the first bias voltage, detector 111 is operable to detect first infrared radiation 106 and generate current for collection and processing by readout integrated circuit 113. A second bias voltage having an opposite polarity as the first bias voltage is generated by readout integrated circuit 113, and is a negative bias for second p-n junction 124 and a positive bias for first p-n junction 122, which deactivates first p-n junction 122 and activates second p-n junction 124. With the second bias voltage, detector 111 is operable to detect second infrared radiation 108 and generate current for collection and processing by readout integrated circuit 113. In one implementation, the first and second bias voltages are applied sequentially. Moreover, readout integrated circuit 113 can include a microchip, including at least a processing device and circuitry, that facilitates providing first and second bias voltages to focal plane array 102.

Dual-band infrared detector 111 may be formed using any process that enables focal plane array 102 to function as described herein. For example, buffer layer 132, contact layer 126, first absorption layer 112, barrier layers 118, barrier layers 120, second absorption layer 116, and contact layer 128 are grown on substrate 130 in succession using a molecular beam epitaxy (MBE) process.

Figure 3:
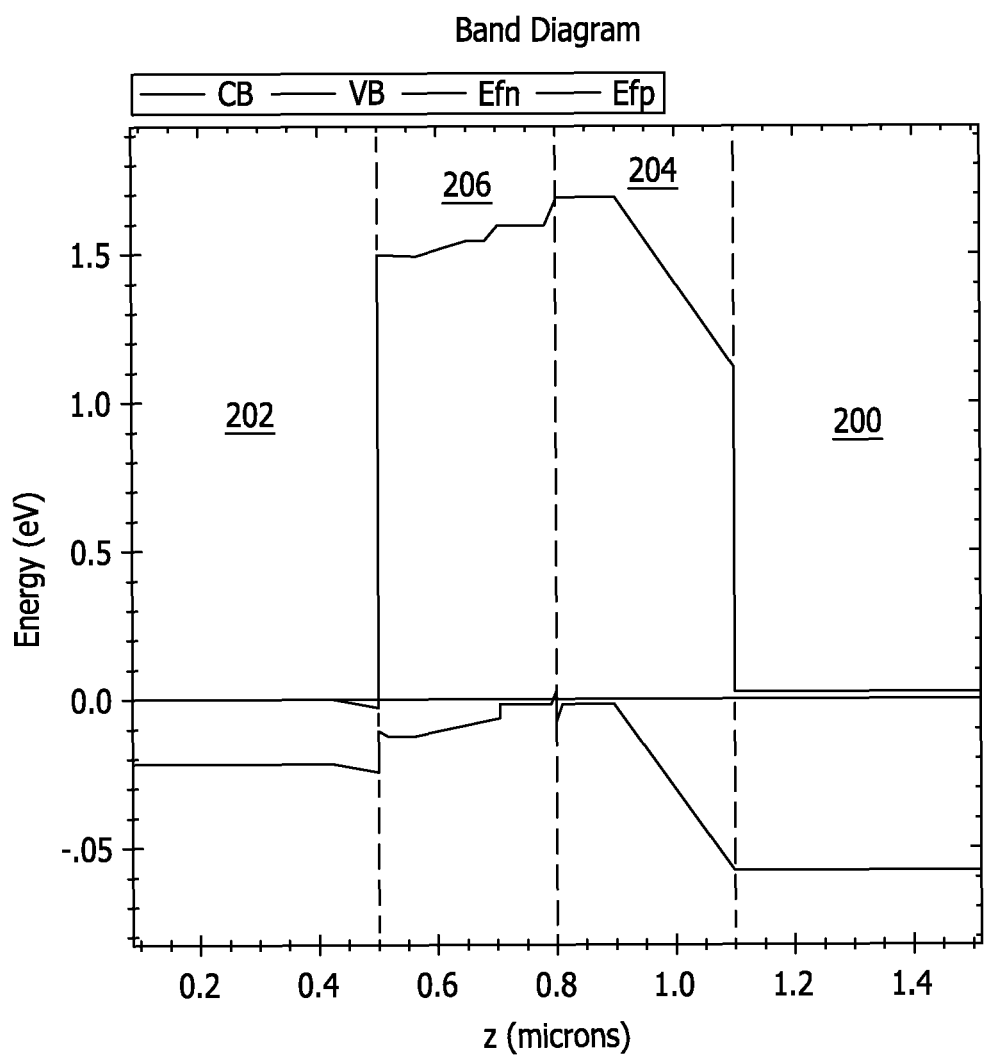
FIG. 3 is a band diagram of the dual-band infrared detector shown in FIG. 2.

FIG. 3 is a band diagram of the dual-band infrared detector shown in FIG. 2. In the exemplary implementation, a first region 200 corresponds to the material used to form first absorption layer 112, a second region 202 corresponds to the material used to form second absorption layer 116, a third region 204 corresponds to the material used to form SWIR barrier layers 118, and a fourth region 206 corresponds to the material used to form MWIR barrier layers 120.

The different materials shown in second and third regions 202 and 204 have a low valence band discontinuity, relative to the other materials used to form dual-band infrared detector 111, to ensure the proper extraction of carriers and to reduce tunneling currents. The bandgap of fourth region 206 is wide to facilitate blocking majority carriers, and to facilitate reducing tunneling and generation-recombination current.

The materials shown in first and third regions 200 and 204 should have a low valence band discontinuity, relative to the other materials used to form dual-band infrared detector 111, to ensure the proper extraction of carriers and to reduce tunneling currents. The bandgap of third region 204 is wide to facilitate blocking majority carriers, and to facilitate reducing tunneling and generation-recombination current.

The doping of materials shown in third and fourth regions 204 and 206 should be high, relative to the other materials used to form dual-band infrared detector 111. For example, in the exemplary implementation, the doping is in the order of $1.0 \times 10^{18}$ cm$^{-3}$ to facilitate the transfer of minority carriers between the first p-n junction 122 (SWIR detector) and second p-n junction 124 (MWIR detector). This mitigates the effect of a potential discontinuity in the valence bands between interfacing barrier layers between SWIR barrier layers 118 and MWIR barrier layers 120.

Figure 4:
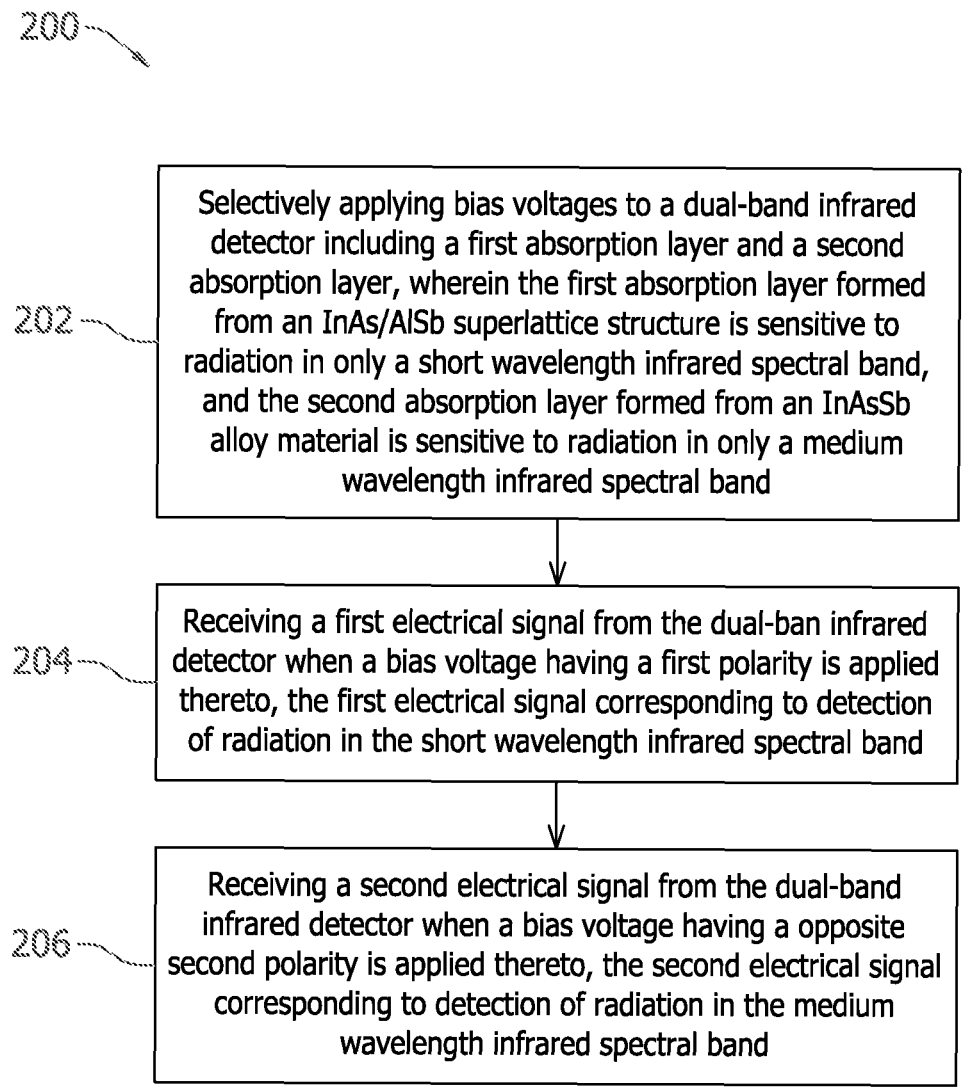
FIG. 4 is an exemplary flow diagram illustrating a method of detecting multiple bands of infrared radiation.

FIG. 4 is an exemplary flow diagram illustrating a method 200 of detecting multiple bands of infrared radiation. Method includes selectively applying 202 a bias voltage to dual-band infrared detector 111 including first absorption layer 112 and second absorption layer 116. First absorption layer 112, formed from an InAs/AlSb superlattice structure, is sensitive to radiation in only a short wavelength infrared spectral band, and second absorption layer 116, formed from an InAsSb alloy material, is sensitive to radiation in only a medium wavelength infrared spectral band. Method 200 also includes receiving 204 a first electrical signal from dual-band infrared detector 111 when the bias voltage having a first polarity is applied thereto, and receiving 206 a second electrical signal from dual-band infrared detector 111 when the bias voltage having an opposite second polarity is applied thereto. The first electrical signal corresponds to detection of radiation in the short wavelength infrared spectral band, and the second electrical signal corresponds to detection of radiation in the medium wavelength infrared spectral band.

In one implementation, selectively applying 202 a bias voltage includes applying the bias voltages to dual-band infrared detector 111 sequentially. Moreover, method 200 includes selectively applying the bias voltage to first absorption layer 112 sensitive to wavelengths of up to 2.5 micrometers, and selectively applying the bias voltage to second absorption layer 116 sensitive to wavelengths within a range between 2.5 micrometers and 5 micrometers.

The implementations described herein relate to a back-to-back heterojunction designed to facilitate backside illumination. In the exemplary implementation, two p-n junctions are grown back-to-back on a substrate, for example. A first p-n junction performs SWIR detection, and a second p-n junction performs MWIR detection. In operation, radiation passes through materials used to form the first p-n junction because it is substantially transparent in the MWIR spectral band, and vice versa. More specifically, the detection band of the dual-band infrared detector described herein can be selected by switching the voltage bias applied to layers of the detector. As such, the dual-band infrared detector described herein is structured to enable each of the SWIR and MWIR detectors to be utilized independently. Moreover, the wide barrier configuration facilitates restricting majority carriers, and facilitates reducing surface defects from forming within the dual-band infrared detector.

This written description uses examples to disclose various implementations, including the best mode, and also to enable any person skilled in the art to practice the various implementations, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A dual-band infrared detector comprising:
   a first absorption layer sensitive to radiation in only a short wavelength infrared spectral band;
   a plurality of barrier layers coupled to said first absorption layer; and
   a second absorption layer coupled to said plurality of barrier layers opposite said first absorption layer, said second absorption layer sensitive to radiation in only a medium wavelength infrared spectral band, wherein said first and second absorption layers are formed from materials having a lattice parameter mismatch less than a predetermined threshold, and wherein said plurality of barrier layers comprises:
      a first group of barrier layers coupled directly against said first absorption layer, each of said first group of barrier layers comprising a first barrier material having a wide bandgap relative to a bandgap of said first absorption layer; and
      a second group of barrier layers coupled directly against said second absorption layer, each of said second group of barrier layers comprising a second barrier material different from said first barrier material, wherein said second group of barrier layers is coupled directly against said first group of barrier layers.

2. The dual-band infrared detector in accordance with claim 1, wherein said first and second absorption layers are formed from materials having a lattice parameter mismatch of less than 0.8 percent.

3. The dual-band infrared detector in accordance with claim 1, wherein said first absorption layer is sensitive to wavelengths of up to 2.5 micrometers.

4. The dual-band infrared detector in accordance with claim 1, wherein said second absorption layer is sensitive to wavelengths throughout a range between 2.5 micrometers and 5 micrometers.

5. The dual-band infrared detector in accordance with claim 1, wherein said first absorption layer is formed from a superlattice structure comprising at least one layer of a first semiconductor material and at least one layer of a second semiconductor material.

6. The dual-band infrared detector in accordance with claim 5, wherein said first semiconductor material comprises Indium and Arsenic, and wherein said second semiconductor material comprises Aluminum and Antimony.

7. The dual-band infrared detector in accordance with claim 1, wherein said second absorption layer comprises Indium, Arsenic, and Antimony.

8. The dual-band infrared detector in accordance with claim 1, wherein said second barrier material comprises AlGaSb and said first barrier material comprises AlAsSb.

9. The dual-band infrared detector in accordance with claim 1 further comprising:
   a first p-n junction comprising said first absorption layer and at least said first group of barrier layers; and
   a second p-n junction comprising said second absorption layer and at least said second group of barrier layers.

10. The dual-band infrared detector in accordance with claim 1 further comprising:
    at least one buffer layer coupled to said first absorption layer; and
    a substrate coupled to said at least one buffer layer.

11. An imaging system comprising:
    a readout integrated circuit; and
    a dual-band infrared detector electrically coupled to said readout integrated circuit, wherein said dual-band infrared detector comprises:
       a first absorption layer, said first absorption layer sensitive to radiation in only a short wavelength infrared spectral band;
       a plurality of barrier layers coupled to said first absorption layer; and
       a second absorption layer coupled to said plurality of barrier layers opposite said first absorption layer, said second absorption layer sensitive to radiation in only a medium wavelength infrared spectral band, wherein said first and second absorption layers are formed from materials having a lattice parameter mismatch of less than a predetermined threshold,
    wherein said readout integrated circuit is configured to selectively apply a bias voltage to said dual-band infrared detector, and wherein said plurality of barrier layers comprises:
       a first group of barrier layers coupled directly against said first absorption layer, each of said first group of barrier layers comprising a first barrier material having a wide bandgap relative to a bandgap of said first absorption layer; and a second group of barrier layers coupled directly against said second absorption layer, each of said second group of barrier layers comprising a second barrier material different from said first barrier material, wherein said second group of barrier layers is coupled directly against said first group of barrier layers.

12. The dual-band infrared detector in accordance with claim 11, wherein said first absorption layer is sensitive to wavelengths of up to 2.5 micrometers.

13. The dual-band infrared detector in accordance with claim 11, wherein said second absorption layer is sensitive to wavelengths throughout a range between 2.5 micrometers and 5 micrometers.

14. The dual-band infrared detector in accordance with claim 11, wherein said first absorption layer is formed from a superlattice structure comprising at least one layer of a first semiconductor material and at least one layer of a second semiconductor material.

15. The dual-band infrared detector in accordance with claim 14, wherein said first semiconductor material comprises Indium and Arsenic, and wherein said second semiconductor material comprises Aluminum and Antimony.

16. The dual-band infrared detector in accordance with claim 11, wherein said second absorption layer comprises Indium, Arsenic, and Antimony.

17. A method of detecting multiple bands of infrared radiation, said method comprising:
   selectively applying bias voltages to a dual-band infrared detector including a first absorption layer and a second absorption layer, wherein the first absorption layer formed from an InAs/AlSb superlattice structure is sensitive to radiation in only a short wavelength infrared spectral band, and the second absorption layer formed from an InAsSb alloy material is sensitive to radiation in only a medium wavelength infrared spectral band, wherein the dual band infrared detector further includes:
      a first group of barrier layers each formed from a first barrier material, the first group of barrier layers coupled directly against the first absorption layer, and
      a second group of barrier layers each formed from a second barrier material, the second group of barrier layers coupled directly against the second absorption layer, the first barrier material having a wide bandgap relative to a bandgap of the first absorption layer, the second barrier material different from the first barrier material, wherein the second group of barrier layers is coupled directly against the first group of barrier layers;
   receiving a first electrical signal from the dual-band infrared detector when a bias voltage having a first polarity is applied thereto, the first electrical signal corresponding to detection of radiation in the short wavelength infrared spectral band; and
   receiving a second electrical signal from the dual-band infrared detector when a bias voltage having a opposite second polarity is applied thereto, the second electrical signal corresponding to detection of radiation in the medium wavelength infrared spectral band.

18. The method in accordance with claim 17, wherein selectively applying bias voltages comprises applying the bias voltages to the dual-band infrared detector sequentially.

19. The method in accordance with claim 17 further comprising selectively applying the bias voltage to the first absorption layer sensitive to wavelengths of up to 2.5 micrometers.

20. The method in accordance with claim 17 further comprising selectively applying the bias voltage to the second absorption layer sensitive to wavelengths throughout a range between 2.5 micrometers and 5 micrometers.

21. The dual-band infrared detector in accordance with claim 1, wherein said first group of barrier layers comprises a plurality of SWIR barrier layers, and said second group of barrier layers comprises a plurality of MWIR barrier layers.

22. A dual-band infrared detector comprising:
   a first absorption layer sensitive to radiation in only a short wavelength infrared spectral band;
   a first group of barrier layers in contact with said first absorption layer, each of said first group of barrier layers comprising a first barrier material;
   a second group of barrier layers in contact with said first group of barrier layers, each of said second group of barrier layers comprising a second barrier material different from said first barrier material; and
   a second absorption layer in contact with said second group of barrier layers, said second absorption layer sensitive to radiation in only a medium wavelength infrared spectral band, wherein said first and second absorption layers are formed from materials having a lattice parameter mismatch less than a predetermined threshold.

23. The dual-band infrared detector in accordance with claim 22, wherein said first group of barrier layers comprises a plurality of SWIR barrier layers, and said second group of barrier layers comprises a plurality of MWIR barrier layers.

* * * * *